(12) United States Patent
Liu

(10) Patent No.: US 7,786,796 B2
(45) Date of Patent: Aug. 31, 2010

(54) AUDIO AMPLIFIER

(75) Inventor: Yu-Ren Liu, Hsinchu County (TW)

(73) Assignee: ITE Tech. Inc., Hsinchu (TW)

( * ) Notice: Subject to any disclaimer, the term of this patent is extended or adjusted under 35 U.S.C. 154(b) by 43 days.

(21) Appl. No.: 12/365,873

(22) Filed: Feb. 4, 2009

(65) Prior Publication Data

US 2010/0134185 A1   Jun. 3, 2010

(30) Foreign Application Priority Data

Dec. 1, 2008   (TW) .............................. 97146617 A

(51) Int. Cl.
  *H03F 3/38* (2006.01)
  *H03F 3/217* (2006.01)
(52) U.S. Cl. ..................... 330/10; 330/207 A
(58) Field of Classification Search ................... 330/10, 330/207 A, 251
  See application file for complete search history.

(56) References Cited

U.S. PATENT DOCUMENTS 6,211,728 B1   4/2001 Chen et al.
6,614,297 B2   9/2003 Score et al.
7,339,425 B2 *   3/2008 Yang ........................... 330/10
2008/0284511 A1 *   11/2008 De Cremoux ............... 330/251

* cited by examiner

*Primary Examiner*—Steven J Mottola
(74) *Attorney, Agent, or Firm*—Jianq Chyun IP Office

(57) ABSTRACT

An audio amplifier including a differential mode integrator, a first comparator, a second comparator, a logic circuit and a driving unit is provided. The differential mode integrator receives a differential input signal and a differential output signal and outputs a differential mode intermediate signal. The first comparator has a positive input terminal receiving a first terminal signal of the differential mode intermediate signal, a negative input terminal receiving a ramp signal, and generates a first signal. The second comparator has a positive input terminal receiving a ramp signal, a negative input terminal receiving a second terminal signal of the differential mode intermediate signal, and generates a second signal. The logic circuit performs a logic operation on the first and second signals to generate a third signal and a fourth signal. The driving unit generates a differential output signal to drive a load according to the third and fourth signals.

7 Claims, 3 Drawing Sheets ly, the present invention relates to an audio amplifier
AUDIO AMPLIFIER

CROSS-REFERENCE TO RELATED APPLICATION

This application claims the priority benefit of Taiwan application serial no. 97146617, filed on Dec. 1, 2008. The entirety of the above-mentioned patent application is hereby incorporated by reference herein and made a part of specification.

BACKGROUND OF THE INVENTION

1. Field of the Invention

The present invention relates to an audio amplifier. More particularly, the present invention relates to an audio amplifier that can reduce the common mode voltages of the differential mode output signals and reduce the silicon area used.

2. Description of Related Art

FIG. 1 shows a schematic circuit block diagram of a conventional audio amplifier. Referring to FIG. 1, generally, when an audio amplifier 100 is operating, voltages of output signals Voutp and Voutn will be higher than voltages of input signals Vinp and Vinn received by an amplifier 110. Moreover, the audio amplifier 100 outputted signals, Voutp and Voutn, may both be at a logic high voltage level 1. Thus, the output signals Voutp and Voutn have high common mode voltages. Since the output signals Voutp and Voutn will feedback to the input terminal of the amplifier 110, the voltages of the input signals Vinp and Vinn of the amplifier 110 are elevated as well.

Therefore, to the amplifier 110 using a PMOS input pair, as the voltages of the input signals Vinp and Vinn are elevated, a dimension of the PMOS input pair has to be increased. Therefore, the element dimension (W/L) of the PMOS is increased, and too much silicon area will be wasted as a consequence. Moreover, the audio amplifier 100 can not operate normally if the voltages of the input signals Vinp and Vinn of the amplifier are too high.

SUMMARY OF THE INVENTION

The present invention provides an audio amplifier, which consequently reduces an silicon area used and also reduces common mode voltages of the differential mode output signals.

An audio amplifier is provided in the present invention. The audio amplifier includes a differential mode integrator, a first comparator, a second comparator, a logic circuit, and a driving unit. The differential mode integrator receives a differential mode input signal and a differential mode output signal, and performs an integration operation to output a differential mode intermediate signal. The first comparator has a positive input terminal receiving a first terminal signal of the differential mode intermediate signals, a negative input terminal receives a ramp signal, and an output terminal generating a first signal. The second comparator has a positive input terminal receiving the ramp signal, a negative input terminal receiving a second terminal signal of the differential mode input signals, and an output terminal generating a second signal. The logic circuit is coupled to the first comparator and the second comparator to perform a logic operation on the first and the second signals to generate a third signal and a fourth signal. The driving unit generates the differential mode output signals to drive a load according to the third and the fourth signals.

In one embodiment of the present invention, the differential mode integrator includes a first resistor, a second resistor, a third resistor, a fourth resistor, an operational amplifier, a first capacitor, and a second capacitor. A first terminal of the first resistor receives a first terminal signal of the differential mode input signals. A first terminal of the second resistor receives a second terminal signal of the differential mode input signals. A first terminal of the third resistor receives a first terminal signal of the differential mode output signals. A first terminal of the fourth resistor receives a second terminal signal of the differential mode output signals. A first input terminal of the operational amplifier is coupled to a second terminal of the first resistor and a second terminal of the third resistor. A second input terminal of the operational amplifier is coupled to a second terminal of the second resistor and a second terminal of the fourth resistor. Moreover, a first output terminal and a second output terminal of the operational amplifier respectively output a first terminal signal and a second terminal signal of the differential mode intermediate signals. A first terminal of the first capacitor is coupled to the second output terminal of the operational amplifier, and a second terminal of the second capacitor is coupled to the first input terminal of the operational amplifier. A first terminal of the second capacitor is coupled to the first output terminal of the operational amplifier, and a second terminal of the second capacitor is coupled to the second input terminal of the operational amplifier.

In one embodiment of the present invention, the logic circuit includes a first inverter, a second inverter, a first AND gate, and a second AND gate. The first inverter receives and inverts the first signal to generate a first inverting signal. The second inverter receives and inverts the second signal to generate a second inverting signal. A first input terminal of the first AND gate receives the first signal, a second input terminal of the first AND gate receives the second signal, and an output terminal of the first AND gate generates the third signal. A first input terminal of the second AND gate receives the first inverting signal, a second input terminal of the second AND gate receives the second inverting signal, and an output terminal of the second AND gate generates the fourth signal.

In one embodiment of the present invention, the driving unit is a half bridge circuit.

In one embodiment of the present invention, the ramp signal is a triangle wave signal.

In one embodiment of the present invention, the differential mode input signals are audio signals.

In one embodiment of the present invention, the load includes a speaker.

The present invention generates the first signal and the second signal by transmitting the ramp signal respectively to the negative input terminal of the first comparator and the positive input terminal of the second comparator. Afterward, the first and the second signals pass through the logic circuit to perform the logic operation, such that the third and the fourth signals (that is, the differential mode output signals) are not at a logic high voltage level at the same time. Hence, the common mode voltages of the differential mode output signals can be reduced effectively and consequently reduce the silicon area of the operational amplifier layout.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A class-D amplifier is used as an embodiment of the present invention. However, the present invention is not limited thereof. Anyone skilled in the art can apply the present invention on various classes of amplifiers, for example, class-A, class-B, and class-AB amplifiers, based on the spirit of the present invention.

Figure 1:
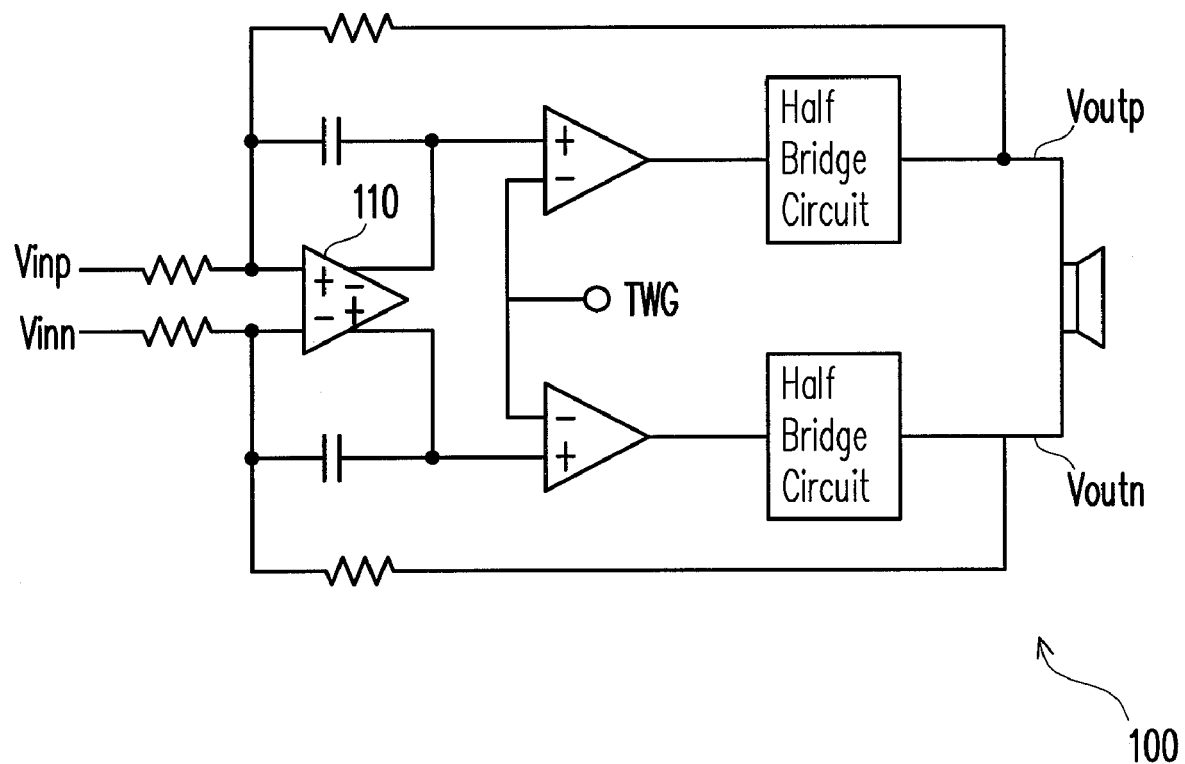
FIG. 1 shows a schematic circuit diagram of a conventional audio amplifier.
Figure 2:
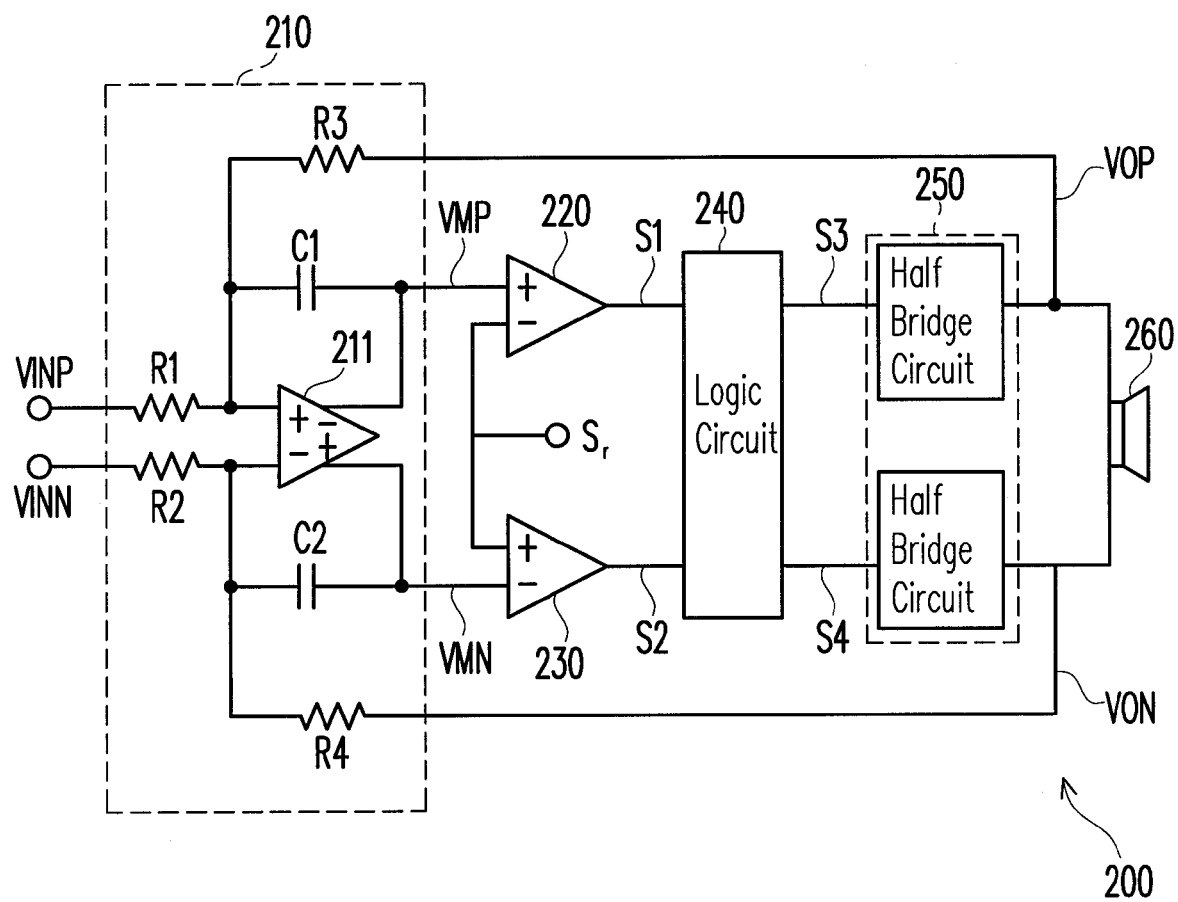
FIG. 2 is a circuit block diagram depicting an audio amplifier according to an embodiment of the present invention.

FIG. 2 is a circuit block diagram depicting an audio amplifier according to an embodiment of the present invention. Referring to FIG. 2, an audio amplifier 200 includes a differential mode integrator 210, a first comparator 220, a second comparator 230, a logic circuit 240, and a driving unit 250. The differential mode integrator 210 receives differential mode input signals VINP, VINN and differential mode output signals VOP, VON, and performs an integration operation to output differential mode intermediate signals VMP and VMN.

The first comparator 220 has a positive input terminal that receives a first terminal signal VMP of the differential mode intermediate signals, a negative input terminal that receives a ramp signal Sr, and an output terminal that generates a first signal S1. The second comparator 230 has a positive input terminal that receives the ramp signal Sr, a negative input terminal that receives a second terminal signal VMN of the differential mode input signals, and an output terminal that generates a second signal.

The logic circuit 240 is coupled to the first comparator 220 and the second comparator 230 to perform a logic operation on the first signal S1 and the second signal S2 to generate a third signal S3 and a fourth signal S4. The driving unit 250 generates the differential mode output signals VOP and VON to drive a load 260 according to the third signal S3 and the fourth signal S4. In the present embodiment, the driving unit 250 may be a half bridge circuit. The ramp signal Sr may be a triangle wave signal. The load 260 may be a speaker or other loads, and the differential mode input signals VINP and VINN may be audio signals.

In the present embodiment, the differential mode integrator 210 includes a first resistor R1, a second resistor R2, a third resistor R3, a fourth resistor R4, an operational amplifier 211, a first capacitor C1, and a second capacitor C2. The first resistor R1 has a first terminal that receives the first terminal signal VINP of the differential mode input signals. The second resistor R2 has a first terminal that receives the second terminal signal VINN of the differential mode input signals. The third resistor R3 has a first terminal that receives the first terminal signal VOP of the differential mode output signals. The fourth resistor R4 has a first terminal that receives a second terminal signal VON of the differential mode output signals.

A first input terminal (for example, a positive input terminal) of the operational amplifier 211 is coupled to a second terminal of the first resistor R1 and a second terminal of the third resistor R3. A second input terminal (for example, a negative input terminal) of the operational amplifier 211 is coupled to a second terminal of the second resistor R2 and a second terminal of the fourth resistor R4. Moreover, a first output terminal (i.e., a negative output terminal) and a second output terminal (i.e., a positive output terminal) of the operational amplifier 211 output the first terminal signal VMP and the second terminal signal VMN of the differential mode intermediate signals respectively.

A first terminal of the first capacitor C1 is coupled to the second output terminal of the operational amplifier 211, and a second terminal of the first capacitor C1 is coupled to the first input terminal of the operational amplifier 211. A first terminal of the second capacitor C2 is coupled to the first output terminal of the operational amplifier 211, and a second terminal of the second capacitor C2 is coupled to the second input terminal of the operational amplifier 211.

In the overall operation, the first signal S1 and the second signal S2 with a pulse-mode are generated when the first terminal signal VMP of the differential mode intermediate signal and the second terminal signal VMN of the differential mode intermediate signal pass through the first comparator 220 and the second comparator 230 respectively. Next, the first signal S1 and the second signal S2 are transmitted to the logic circuit 240 to perform the operation.

In the present embodiment, in order to prevent the differential mode output signals VOP and VON from both being at a logic high voltage level 1, when the first signal S1 and the second signal S2 are both at the logic high voltage level 1 and inputted to the logic circuit 240, the third signal S3 generated by the logic circuit 240 is at the logic high voltage level 1, and the fourth signal S4 generated by the logic circuit 240 is at a logic low voltage level 0. Hence, the differential mode output signals VOP and VON will not be at the logic high voltage level 1 at the same time and thereby reduce common mode voltages of the differential mode output signals VOP and VON, and further reduce the silicon area of the input pair in the operational amplifier 211. An operation truth table of the logic circuit 240 may be represented as Table 1.

TABLE 1

An operation truth table of the logic circuit 240.

| S1 | S2 | S3 | S4 |
|---|---|---|---|
| 1 | 1 | 1 | 0 |
| 0 | 0 | 0 | 1 |
| 0 | 1 | 0 | 0 |
| 1 | 0 | 0 | 0 |

Figure 3:
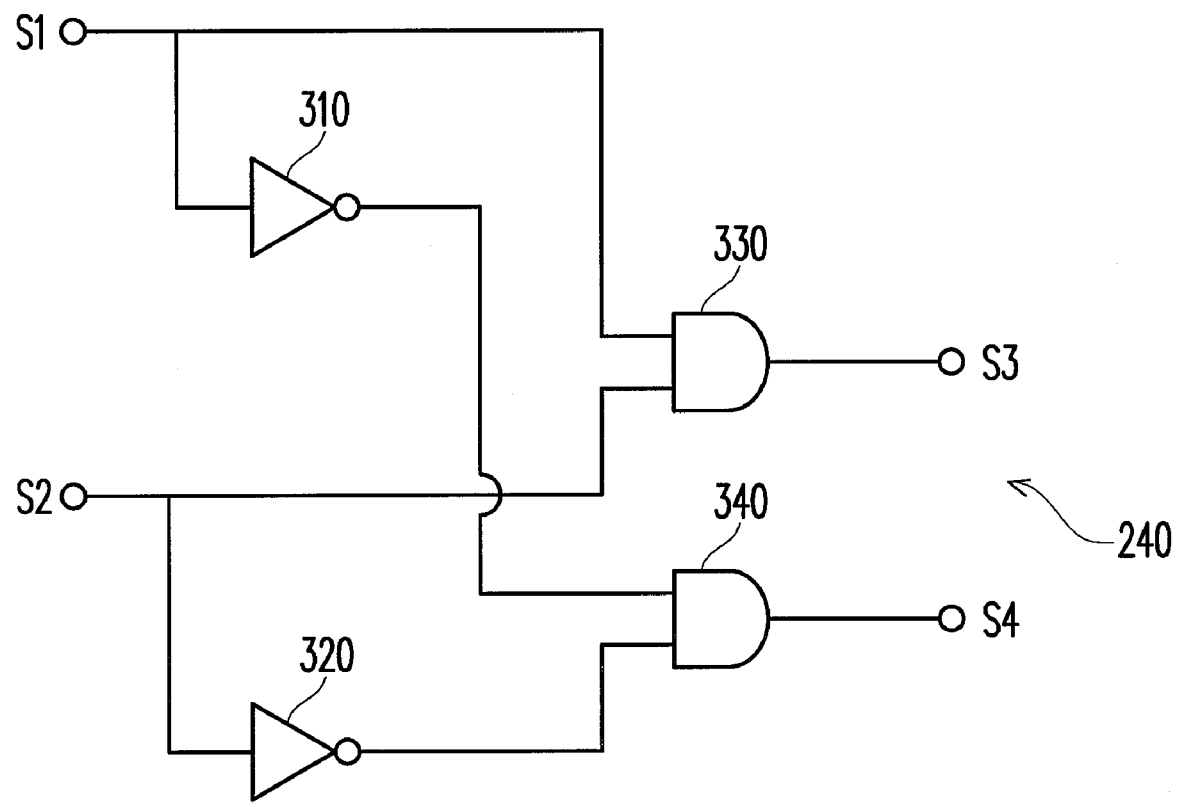
FIG. 3 is an internal circuit diagram of a logic circuit 240.

Next, in order to make the present embodiment more comprehensible for those skilled in the art, the internal circuit of the logic circuit 240 will be illustrated in detail. FIG. 3 is an internal circuit diagram of the logic circuit according to an embodiment of the present invention. Referring to FIG. 3, the logic circuit 240 includes a first inverter 310, a second inverter 320, a first AND gate 330, and a second AND gate 340. The first inverter 310 receives and inverts the first signal S1 to generate a first inverting signal. The second inverter 320 receives and inverts the second signal S2 to generate a second inverting signal.

The first AND gate 330 has a first input terminal that receives the first signal S1, a second input terminal that receives the second signal S2, and an output terminal that generates the third signal S3. The second AND gate 340 has a first input terminal that receives the first inverting signal, a second input terminal that receives the second inverting signal, and an output terminal that generates the fourth signal S4.

In the overall operation, please refer to FIG. 3 and Table 1 simultaneously. Firstly, when both the first signal S1 and the second signal S2 are at the logic high voltage level 1, the third signal S3 generated by the output terminal of the first AND gate 330 is at the logic high voltage level 1. On the other hand, the first signal S1 and the second signal S2 pass the first inverter 310 and the second converter 320 respectively, such that the first signal S1 and the second signal S2 are inverted (that is, converted from the logic high voltage level to the logic low voltage level) and inputted to the second AND gate 340. Moreover, the fourth signal S4 generated by the output terminal of the second AND gate 340 is at the logic low voltage level 0.

Moreover, when both the first signal S1 and the second signal S2 are at the logic high voltage level 1, the third signal S3 generated by the output terminal of the first AND gate 330 is at the logic low voltage level 0. On the other hand, the first signal S1 and the second signal S2 pass the first inverter 310 and the second converter 320 respectively, such that the first signal S1 and the second signal S2 are inverted (that is, converted from the logic low voltage level to the logic high voltage level) and inputted to the second AND gate 340. Moreover, the fourth signal S4 generated by the output terminal of the second AND gate 340 is at the logic high voltage level 1.

Furthermore, when the first signal S1 is at the logic high voltage level 1 and the second signal S2 is at the logic low voltage level 0, or when the first signal S1 is at the logic low voltage level 0 and the second signal S2 is at the logic high voltage level 1, the third signal S3 generated by the output terminal of the first AND gate 330 is at the logic low voltage level 0. On the other hand, the first signal S1 and the second signal S2 pass the first inverter 310 and the second converter 320 respectively, and are inputted to the second AND gate 340 such that the fourth signal S4 generated by the output terminal of the second AND gate 340 is at the logic low voltage level 1.

Accordingly, a situation where the third signal S3 and the fourth signal S4 are both at the logic high voltage level 1 has been eliminated. Hence, a situation where the differential mode output signals VOP and VON are both at the logic high voltage level 1 is also eliminated. As the differential mode output signals VOP and VON can not both be at the logic high voltage level 1, the present embodiment can reduce the common mode voltages of the differential mode output signals VOP and VON, and thereby reduce the silicon area of the input pair in the operational amplifier 211 (that is, reducing the element dimension W/L of the PMOS). Besides, as the common mode voltages of the differential mode output signals VOP and VON decrease, the input signal voltages inputted to the operational amplifier 211 also decrease to prevent the input signal voltages inputted into the operational amplifier 211 from being too high and cause the audio amplifier 200 operate abnormally.

In summary, the present invention generates the first signal and the second signal by transmitting the ramp signal respectively to the negative input terminal of the first comparator and the positive input terminal of the second comparator. Afterward, the logic operation is performed on the first and the second signals through the logic circuit, such that the third signal and the fourth signal (that is, the differential mode output signals) are not at the logic high voltage level at the same time. Therefore, the common mode voltages of the differential mode output signals can be reduced effectively and consequently reduce the silicon area of the operational amplifier layout. Moreover, as the common mode voltages of the differential mode output signals decrease, the differential mode input voltages may also decrease to prevent the input signal voltages received by the operation amplifier from being too high and cause the audio amplifier to function abnormally.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An audio amplifier, comprising:
    a differential mode integrator, receiving a differential mode input signal and a differential mode output signal and performing an integration operation to output a differential mode intermediate signal;
    a first comparator, has a positive input terminal receiving a first terminal signal of the differential mode intermediate signal, a negative input terminal receiving a ramp signal, and an output terminal generating a first signal in;
    a second comparator, has a positive input terminal receiving the ramp signal, a negative terminal receiving a second terminal signal of the differential mode input signal, and an output terminal generating a second signal;
    a logic circuit, coupled to the first comparator and the second comparator to perform a logic operation on the first signal and the second signal to generate a third signal and a fourth signal; and
    a driving unit, generating the differential mode output signal to drive a load according to the third signal and the fourth signal.

2. The audio amplifier of claim 1, wherein the differential mode integrator comprises:
    a first resistor, has a first terminal receiving a first terminal signal of the differential mode input signal;
    a second resistor, has a first terminal receiving a second terminal signal of the differential mode input signal;
    a third resistor, has a first terminal receiving a first terminal signal of the differential mode output signal;
    a fourth resistor, has a first terminal receiving a second terminal signal of the differential mode output signal;
    an operational amplifier, has a first input terminal coupling to a second terminal of the first resistor and a second terminal of the third resistor, a second input terminal coupling to a second terminal of the second resistor and a second terminal of the fourth resistor, and a first output terminal and a second output terminal respectively outputting the first terminal signal and the second terminal signal of the differential mode intermediate signal;
    a first capacitor, has a first terminal coupling to the second output terminal of the operational amplifier, and a second terminal coupling to the first input terminal of the operational amplifier; and a second capacitor, has a first terminal coupling to the first output terminal of the operational amplifier, and a second terminal coupling to the second input terminal of the operational amplifier.

3. The audio amplifier of claim 1, wherein the logic circuit comprises:

a first inverter, receiving and inverting the first signal to generate a first inverting signal;

a second inverter, receiving and inverting the second signal to generate a second inverting signal;

a first AND gate, has a first input terminal receiving the first signal, a second input terminal receiving the second signal, and an output terminal generating the third signal; and a second AND gate, has a first input terminal receiving the first inverting signal, a second input terminal receiving the second inverting signal, and an output terminal generating the fourth signal.

4. The audio amplifier of claim 1, wherein the driving unit is a half bridge circuit.

5. The audio amplifier of claim 1, wherein the ramp signal is a triangle wave signal.

6. The audio amplifier of claim 1, wherein the differential mode input signal is an audio signal.

7. The audio amplifier of claim 1, wherein the load includes a speaker.

* * * * *